United States Patent
Takama et al.

(10) Patent No.: US 10,027,861 B2
(45) Date of Patent: Jul. 17, 2018

(54) CAMERA DEVICE

(71) Applicant: DENSO CORPORATION, Kariya, Aichi-pref. (JP)

(72) Inventors: Daisuke Takama, Kariya (JP); Kazuya Kushida, Kariya (JP); Hirokazu Saito, Kariya (JP); Soji Masui, Kariya (JP); Yasuki Furutake, Kariya (JP); Kazuma Yamaguchi, Kariya (JP); Shunsuke Ito, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 0 days.

(21) Appl. No.: 15/446,759

(22) Filed: Mar. 1, 2017

(65) Prior Publication Data
US 2017/0257532 A1    Sep. 7, 2017

(30) Foreign Application Priority Data

Mar. 3, 2016   (JP) .................................. 2016-041183

(51) Int. Cl.
*H04N 5/225*   (2006.01)
*H05K 1/18*   (2006.01)
*H05K 1/02*   (2006.01)

(52) U.S. Cl.
CPC ......... *H04N 5/2252* (2013.01); *H04N 5/2253* (2013.01); *H04N 5/2254* (2013.01);
(Continued)

(58) Field of Classification Search
CPC .... H04N 5/225; H04N 5/2251–5/2254; H05K 1/182–1/185
(Continued)

(56) References Cited

U.S. PATENT DOCUMENTS

2001/0050717 A1\* 12/2001 Yamada ............ H01L 27/14618
348/340
2003/0025824 A1\* 2/2003 Ishikawa ........... H01L 27/14618
348/374
(Continued)

FOREIGN PATENT DOCUMENTS

JP   A-2001-285697   10/2001
JP   A-2005-086659   3/2005
(Continued)

*Primary Examiner* — Anthony J Daniels
(74) *Attorney, Agent, or Firm* — Knobbe, Martens, Olson & Bear, LLP

(57) ABSTRACT

A camera device includes a holder in which an optical member is retained and a circuit board with an image sensor. The circuit board at least includes a stack of a solder resist, a metallic layer, and a resinous layer. A groove or recess is formed in the circuit board to have a depth extending through thicknesses of the solder resist and the metallic layer to expose a portion of an outer surface of the resinous layer. The holder is attached to the exposed portion of the outer surface of the resinous layer using an adhesive agent. An overflow stopper is formed at least round the recess to stop the adhesive agent from flowing outside the recess during a production process, thereby enhancing the degree of joining of the holder and the circuit board, and ensuring the stability in positional relation between the image sensor and the optical member.

7 Claims, 7 Drawing Sheets

(52) U.S. Cl.
CPC ........... *H05K 1/0274* (2013.01); *H05K 1/181* (2013.01); *H05K 2201/09036* (2013.01); *H05K 2201/10121* (2013.01); *H05K 2201/10151* (2013.01)

(58) Field of Classification Search
USPC ................................................ 348/335, 374
See application file for complete search history.

(56) References Cited

U.S. PATENT DOCUMENTS

| | | | |
|---|---|---|---|
| 2010/0302747 A1* | 12/2010 | Komi | G02B 7/022 361/767 |
| 2011/0037887 A1* | 2/2011 | Lee | G02B 13/0035 348/340 |
| 2012/0205768 A1 | 8/2012 | Sugahara et al. | |
| 2013/0194388 A1* | 8/2013 | Busse | H04N 13/02 348/46 |
| 2015/0323758 A1* | 11/2015 | Lee | G03B 3/10 359/824 |
| 2015/0326766 A1* | 11/2015 | Czepowicz | H04N 5/2253 348/360 |
| 2017/0097478 A1* | 4/2017 | Oomori | G02B 6/428 |
| 2017/0244872 A1* | 8/2017 | Wang | H04N 5/2252 |
| 2017/0351052 A1* | 12/2017 | Kim | H02K 41/031 |

FOREIGN PATENT DOCUMENTS

| | | |
|---|---|---|
| JP | A-2012-034073 | 2/2012 |
| JP | 5430027 B2 | 2/2014 |
| JP | A-2014-179795 | 9/2014 |
| JP | A-2014-225777 | 12/2014 |

\* cited by examiner

CAMERA DEVICE

CROSS REFERENCE TO RELATED DOCUMENT

The present application claims the benefit of priority of Japanese Patent Application No. 2016-41183 filed on Mar. 3, 2016, the entire disclosure of which is incorporated herein by reference.

BACKGROUND

1 Technical Field

This disclosure relates generally to a camera device equipped with an image sensor and an optical member which directs light to the image sensor.

2 Background Art

The above type of camera device is known which is equipped with a lens as an optical member. The use of the lens, however, requires a means for ensuring an accurate positional relation between the lens and a circuit board on which an image sensor is mounted in order to capture clear or fine images. To this end, a positional relation between a holder in which the lens is retained and the image sensor may be corrected by means of six-axis adjustment, after which the holder and the circuit board are joined using an adhesive agent. Japanese Patent No. 5430027 proposes, when such an adhesive agent is applied to the circuit board, removing a solder resist from selected areas of the circuit board and then applying the adhesive agent to selected areas of the circuit board.

The removal of the solder resist usually results in improvement of adhesion of the adhesive agent to the circuit board. Application of such techniques to the camera device, therefore, expects the positional relation between the holder and the circuit board to be kept to a certain extent. In order to improve the durability or reliability in operation of the camera device, stronger joint between the holder and the circuit board is expected.

SUMMARY

It is therefore an object to provide a camera device designed to achieve a strong joint between a holder in which an optical member is retained and a circuit board on which an image sensor is mounted.

According to one aspect of this disclosure, there is provided a camera device which comprises: a circuit board, an image sensor, optical member, a holder, a recess, an adhesive agent, and an overflow stopper. The circuit board has a first surface and a second surface opposed to each other through a thickness thereof. The circuit board at least partially includes a stack of a solder resist, a metallic layer, and a resinous layer which are laid in this order from a side of the first surface to a side of the second surface. The image sensor is disposed on the first surface of the circuit board. The optical member works to direct light to the image sensor. The holder retains the optical member. The recess is formed in the first surface of the circuit board by omission of portions of the solder resist and the metallic layer so as to expose a portion of the resinous layer to the recess. The adhesive agent achieves attachment between the portion of the resinous layer exposed to the recess and the holder. In other words, the adhesive agent is attached to the resinous layer to which it has a greater degree of adhesiveness than that of the solder resist or the metallic layer, thus ensuring the stability in joining between the circuit board and the holder, which maintains a desired positional relation between the image sensor and the optical member.

The overflow stopper is seamlessly formed on a portion of a surface of the solder resist which defines the first surface of the circuit board. The overflow stopper forms at least a portion of said recess.

When the adhesive agent has not yet hardened, the overflow stopper works to stop the adhesive agent from flowing out of the recess, thereby enhancing the contribution of the adhesive agent to the mechanical connection between the circuit board and the holder. This results in an increased degree of adhesion between the circuit board and the holder, thereby ensuring the stability in positional relation between the image sensor and the optical member.

BRIEF DESCRIPTION OF THE DRAWINGS

The present invention will be understood more fully from the detailed description given hereinbelow and from the accompanying drawings of the preferred embodiments of the invention, which, however, should not be taken to limit the invention to the specific embodiments but are for the purpose of explanation and understanding only.

In the drawings.

DESCRIPTION OF THE PREFERRED EMBODIMENT

Embodiments of this disclosure will be described below with reference to the drawings.

First Embodiment

Figure 1:
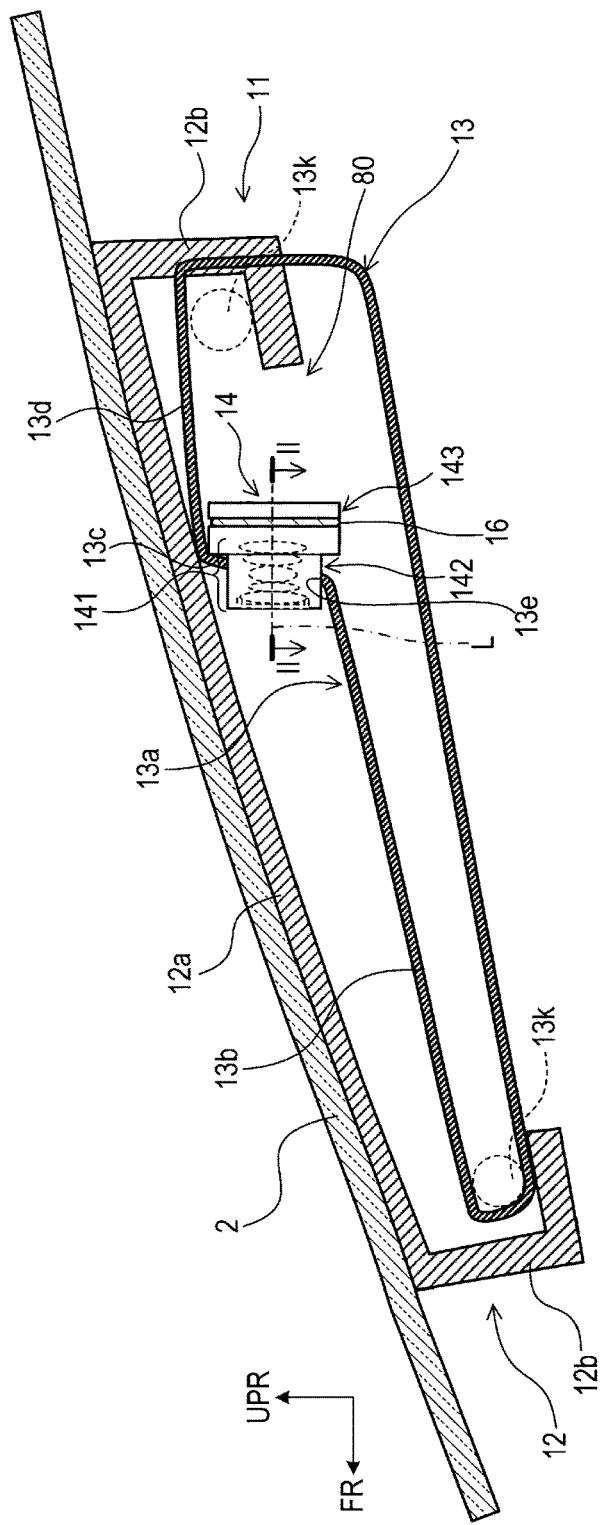
FIG. 1 is a longitudinal sectional view which illustrates a camera device according to the first embodiment.

Referring to FIG. 1, the camera device 11 is a so-called monocular camera and mounted on an inner surface of a front windshield 2 of a vehicle such as an automobile. For the sake of simplicity, FIG. 1 illustrates cross-sections of the front windshield 2 and the bracket 12 (which will be described later in detail) as viewed from the position of a plane through the L-shaped side plates 12*b* of the bracket 12. FIG. 1 also illustrates the case 13, as viewed from the position of a plane extending through an optical axis L of the camera module 14, and the camera module 14, as viewed from a side thereof. Like FIG. 1, each drawing, as will be referred to later, omits some parts of the camera device 11 for the simplicity of illustration.

In the following discussion, the front, rear, right, left, top, and bottom of each part of the camera device 11 are defined as those where the camera device 11 is, illustrated in FIG. 1, attached to the front windshield 2. In other words, the front of each part is oriented in a forward direction of the vehicle. In each drawing, "FR", "UPR", and "RH" represent front, upper, and rightward directions, respectively. These directions are, however, merely defined in this disclosure as expressing positional relation between each part of the camera device 11 for the sake of convenience. In practice, the orientation of the camera device 11 may be selected depending upon usage thereof. For instance, the camera device 11 may be secured to a portion of the vehicle other than the windshield 2 or mounted in or on objects other than vehicles. In this case, "UPR" does not always represents the vertical direction of the camera device 11 defined in relation to gravity.

The camera device 11 includes the bracket 12, the case 13, and the camera module 14. The bracket 12 is made of metal or resin and installed on the front windshield 2 within an occupant compartment of the vehicle. The installation, as referred to herein, contains positioning of the camera device 11. The camera device 11 may be detachably secured to a selected area of the front windshield 2. The bracket 12 includes the upper plate 12a glued to the front windshield 2 and four L-shaped side plates 12b extending downward from front, rear, right, and left sides of the upper plate 12a. The L-shaped side plates 12b each serve as a hook.

The case 13 is made from metal or resin in the form of a box and shaped to have an overall thickness decreasing in the forward direction. In other words, the case 13 has a volume decreasing in the forward direction. The case 13 has the upper surface 13a which is made up of the front flat surface 13b, the upright flat surface 13c, and the rear flat surface 13d.

The front flat surface 13b expands both in the longitudinal and lateral directions of the vehicle. The upright flat surface 13c extends upward from a rear end of the front flat surface 13b. The rear flat surface 13d extends backward from an upper end of the upright flat surface 13c. The upright flat surface 13c has formed in a central portion thereof the exposure hole 13e through which the front end of the camera module 14 is exposed outside the case 13. The exposure hole 13e is located intermediate between the front and rear ends of the upright flat surface 13c which are opposed to each other in the vertical direction and between the right and left ends of the upright flat surface 13c which are opposed to each other in the lateral direction.

The case 13 has near the upper surface 13a four cylindrical mounting bars 13k two of which protrude from the outer right side surface thereof (not shown) and two of which protrude from the outer left side surface thereof. For the sake of simplicity, FIG. 1 perspectively illustrates only two of the mounting bars 13k provided on the right side surface of the case 13. The fixing of the case 13 to the bracket 12 is achieved by hanging or placing the four mounting bars 13k on the four L-shaped side plates 12 of the bracket 12b.

Figure 2:
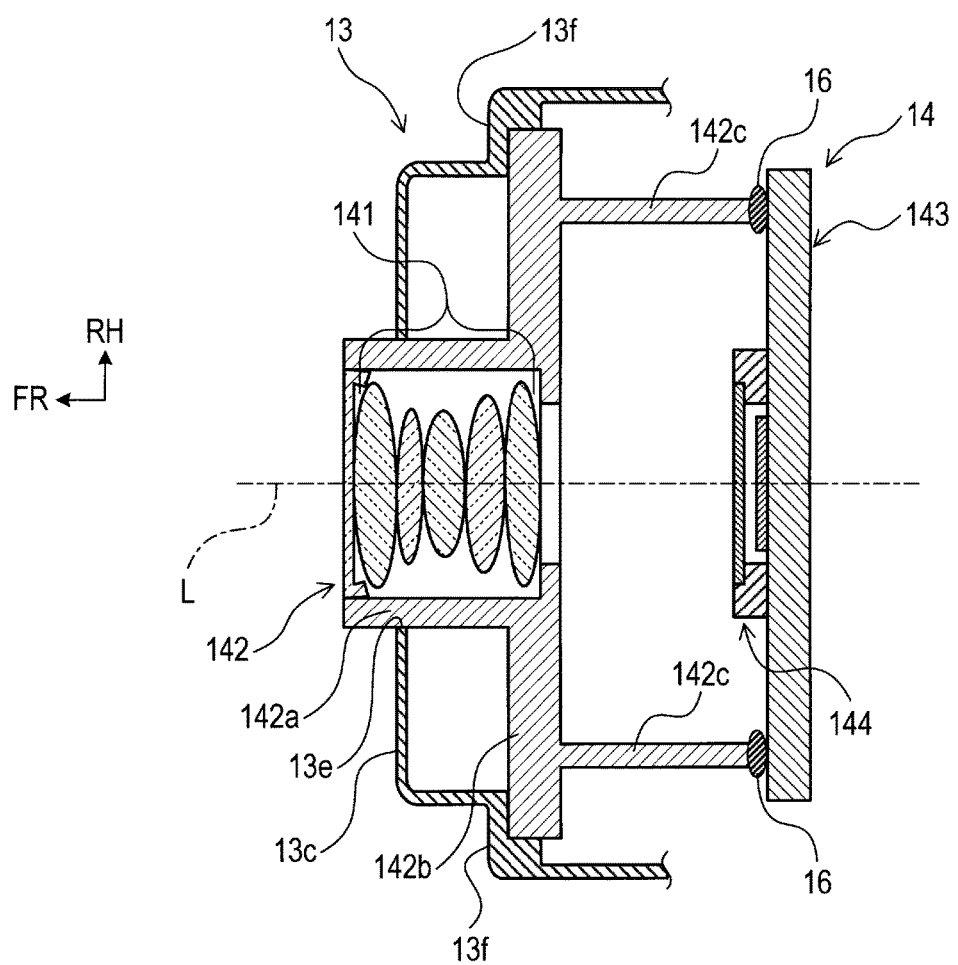
FIG. 2 is a sectional view, as taken along the line II-II in FIG. 1.

The camera module 14, as clearly illustrated in FIG. 2, includes a plurality of lenses 141, the holder 142, and the circuit board 143. The circuit board 143 is implemented by a known camera substrate. The holder 142 includes the hollow cylinder 142a which retains therein the lenses 141 arranged to have the optical axis L which is aligned with the center axis (i.e., the longitudinal center line) of the cylinder 142a. The holder 142 has the base plate 142b which is substantially rectangular in configuration and extends from a rear one of ends of the holder 142 which are opposed in an axial direction of the holder 142. The base plate 142b extends perpendicular to the longitudinal center line (i.e., the center axis) of the holder 142.

The upright flat surface 13c has outer shoulders 13f formed on right and left ends thereof. The shoulders 13f are defined by the recessed right and left ends of the upright flat surface 13c and located closer to the rear end of the case 13 than a central major part of the upright flat surface 13c with the exposure hole 13e is. The base plate 142b has a length extending in the lateral direction and is glued to the inner rear surface of the shoulders 13f of the case 13 using an adhesive agent not shown. In such attachment, the front surface of the base plate 142b is used as a positioning reference surface, thereby orienting or positioning the whole of the camera module 14 relative to the case 13. After the camera module 14 is positioned correctly in such a way, the outer periphery of the cylinder 142a is placed in contact with an inner periphery of the exposure hole 13e to minimize entrance of external light into the case 13. Although not illustrated, a signal processor substrate, not shown, which works to process an image signal captured by the camera module 14 and electric conductors, not shown, connecting between the signal processor substrate and the circuit board 143 are disposed inside the case 13.

The base plate 142b has the hollow cylindrical holder leg 142c rearwardly extending from the rear surface which is on the opposite side of the base plate 142b to the cylinder 142a. The holder leg 142c is rectangular in transverse cross section thereof and formed integrally with the base plate 142b and the cylinder 142a. The cylinder 142a, the base plate 142b, and the holder leg 142c may alternatively be formed as discrete parts separable from each other and joined together using adhesive agent. The holder leg 142c has the rear end surface 142d on the opposite side to the base plate 142b. The rear end surface 142d has, as indcted by a broken line in FIG. 4, a rectangular or square cross section.

The circuit board 143 is a plate-like substrate on which the image sensor 144 is mounted. The circuit board 143 is joined to the rear end of the holder leg 142c of the holder 142 using the adhesive agent 16. As the adhesive agent 16, various types of adhesives, e.g., thermosetting epoxy adhesive may be used.

The circuit board 143, as clearly illustrated in FIG. 3, a front surface (which will also be referred to below as a first surface) and a rear surface (which will also be referred to below as a second surface) opposed to each other through a thickness thereof and is made of a laminate or stack of the solder resist 143a, the metallic layer 143b, the resinous layer 143c, the metallic layer 143d, the resinous layer 143e, the metallic layer 143f, and the solder resist 143g which are arranged in this order in a thickness-wise direction of the circuit board 143. The solder resist 143a defines the front surface (i.e., the first surface) of the circuit board 143 which is bonded to the holder leg 142c. In other words, the circuit board 143 has at least a portion made of a stack of the solder resist 143a, the metallic layer 143b, and the resinous layer 143c which are laid in this order from the side where the circuit board 143 is joined to the holder leg 142c to overlap each other in a thickness-wise direction of the circuit board 143.

The solder resists 143a and 143g serve as protective layers. The metallic layers 143b, 143d, and 143f are made of an electrically conductive metallic thin layer. In this embodiment, the metallic layers 143b, 143d, and 143f are each made of copper foil. The resinous layers 143c and 143e are made of an electrically insulating resin layer. In this embodiment, the resinous layers 143c and 143e are each made from glass epoxy. Specifically, the circuit board 143 in this embodiment is formed by a four-layer glass epoxy board. The resinous layers 143c and 143e may be made from not only pure resin such as paper epoxy, but also glass epoxy resin that is a composite material containing glass fiber.

Structure of Bonded Part

Figure 3:
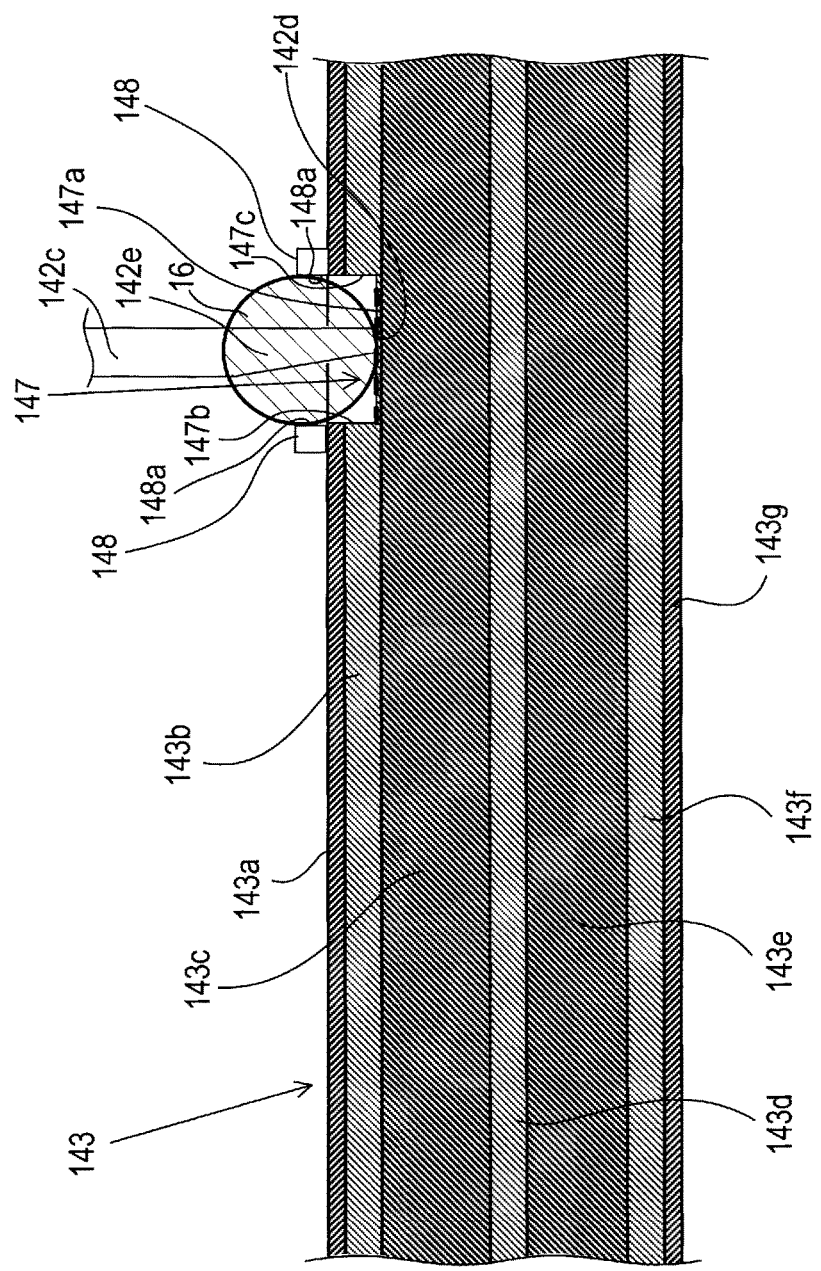
FIG. 3 is a partial sectional view which illustrates a joint of a holder and a circuit board using an adhesive agent in a camera module of the camera device of FIG. 1.
Figure 4:
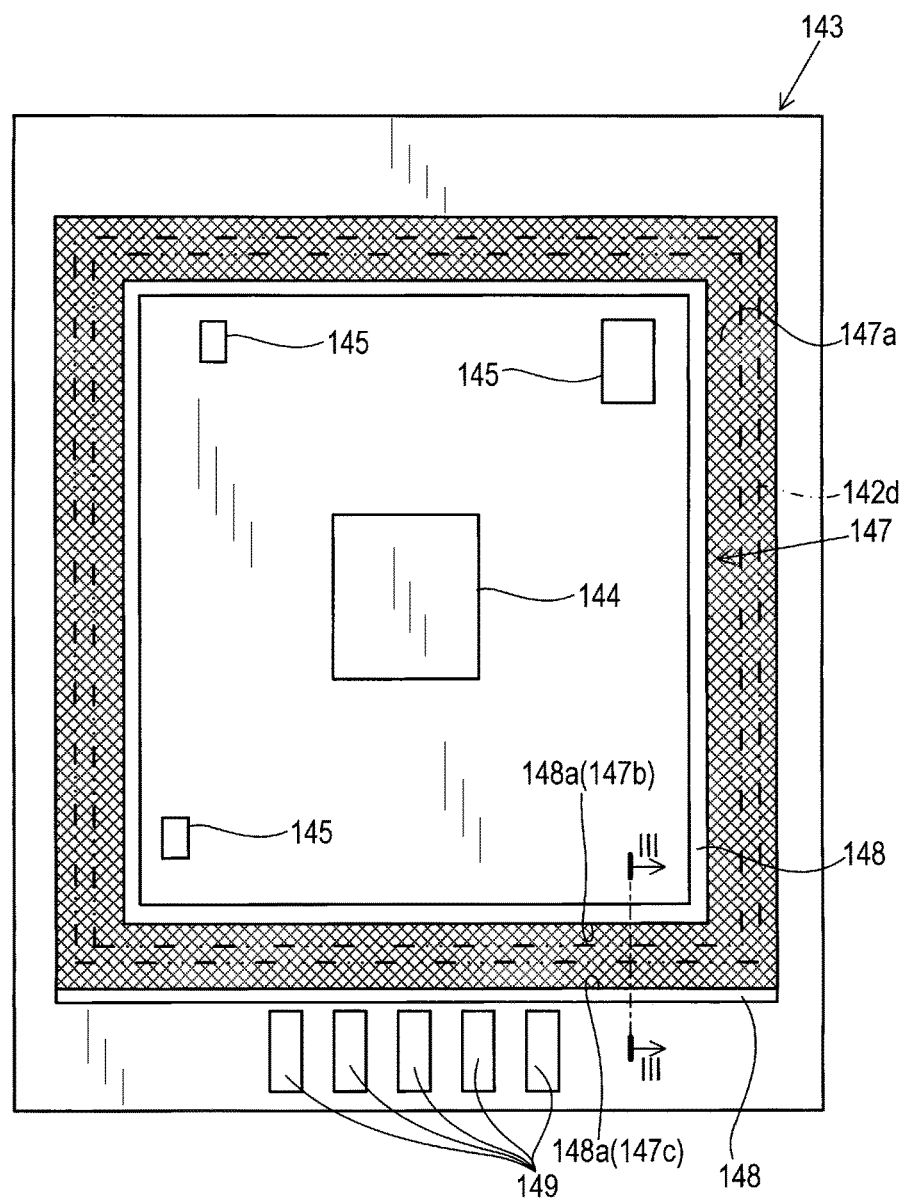
FIG. 4 is a front view which schematically illustrates a circuit board of the camera device of FIG. 1.

The circuit board 143 of this embodiment, unlike typical glass epoxy boards, has the recess 147 formed therein, as clearly illustrated in FIGS. 3 and 4, in the shape of a groove. The recess 147 occupies an area of the surface (i.e., the first surface) of the circuit board 143 to which the holder leg 142c is glued. The recess 147 is made by removing or omitting portions of the solder resist 143a and the metallic layer 143b and exposing the resinous layer 143c to air. The recess 147 is rectangular in cross section and has the bottom surface 147a which is defined by a portion of the outer surface of the resinous layer 143c. In other words, the recess 147 has a depth reaching the outer surface of the resinous layer 143c. The portion of the outer surface of the resinous layer 143c is an adhesive-contacting portion placed in contact with the adhesive agent 16 and forms the bottom surface 147a. At least the portion of the adhesive-contacting portion is subjected to surface treatment to be rougher than the rest of the outer surface of the resinous layer 143c. The surface treatment may be implemented by known surface conditioning treatment, such as ultraviolet treatment or plasma treatment, or known grain finishing or satin finishing. In FIG. 4, the portion of the outer surface of the resinous layer 143c which is subjected to the surface treatment is hatched.

The holder leg 142c has the rear end surface 142d (i.e., a surface of at least a portion of an adhesive-contacting portion of the holder 142 which is placed in contact with the adhesive agent 16) which is, like the bottom surface 147a, subjected to the surface treatment, so that it is rougher than the rest of the surface of the holder leg 142c (i.e., holder 142). The surface treatment, like the above, may be implemented by known surface reforming treatment.

The recess 147 is, as clearly illustrated in FIG. 4, formed in the shape of a frame, in other words, in a rectangular form, as viewed facing the front surface of the circuit board 143, which matches the outline of the rear end surface 142d of the holder leg 142c. The rear end surface 142d is shaped to make a contact with the bottom surface 147a in the rectangular recess 147. The adhesive agent 16 is arranged between the tip portion 142e of the holder leg 142c near the rear end surface 142d and the recess 147 in contact therewith. The tip portion 142e of the holder leg 142c continuing from the rear end surface 142d, as clearly illustrated in FIG. 3, has a chamfered inner surface, in other words, tapers toward the rear end surface 142d in a cross section thereof. In other words, a portion of the holder leg 142c near the rear end surface 142d, that is, the tip portion 142e has a transverse section which decreases in size toward the circuit board 143. The tip portion 142e may alternatively be shaped to have only a chamfered outer surface or both chamfered outer and inner surfaces.

The solder resist 143a, as clearly illustrated in FIGS. 3 and 4, has the ridges or protrusions 148 continuously or seamlessly formed at least partially on edges of an opening of the recess 147. The protrusions 148 are made from ink using serigraph printing techniques.

A plurality of electrodes 149 are, as illustrated in FIG. 4, arranged on the surface of the circuit board 143 on which the solder resist 143a is disposed. The electrodes 149 are arrayed in a direction along one of sides of the circuit board 143. The image sensor 144 is located roughly on the center of the surface of the circuit board 143 and surrounded with the recess 147. The electronic devices 145 are disposed around the image sensor 144 and, like the image sensor 144, surrounded with the recess 147. In this embodiment, the protrusions 148 serve as an overflow stopper to block a flow of the adhesive agent 16 to the image sensor 144, the electronic devices 145, and the electrodes 149. Specifically, a first one of the protrusions 148 (which will also be referred to below as a first protrusion) continuously or seamlessly extends along the inner side wall 147b of the recess 147 which is closer to the image sensor 144 and the electronic devices 145. In other words, the first protrusion 148 extends fully along the whole of four inner sides of the recess 147 and forms at least a portion of the recess 147. A second one of the protrusions 148 (which will also be referred to below as a second protrusion) extends along one of four outer sides (i.e., the side wall 147c) of the recess 147 which is closer to the electrodes 149 and forms a portion of the recess 147. Note that FIG. 3 is a cross-section taken along the line III-III in FIG. 4.

The first protrusion 148, as illustrated in FIG. 3, has the side wall 148a which faces the recess 147. Similarly, the second protrusion 148 has the side wall 148a which faces the recess 147. The side wall 148a of the first protrusion 148 lies flush with the side wall 147b of the recess 147. The side wall 148a of the second protrusion 148 lies flush with the side wall 147c of the recess 147. The side walls 148a of the first and second protrusions 148 may be located slightly outside or away from the recess 147 in order to prevent the first and second protrusions 148 from being located inside the recess 147 due to a tolerance in positioning the protrusions 148 during production thereof. Such misalignment is included in that condition where the side walls 148a lie flush with the side walls 147b and 147c.

The camera module 14 having the above structure is produced in the following steps.

First, the adhesive agent 16 is applied or put between the holder leg 142c and the circuit board 143. The positional relation between the lens 141 and the image sensor 144 is then corrected. Specifically, a Cartesian coordinate system whose one of two coordinate lines (i.e., x- and y-axes) is the optical axis L is defined. Position misalignments of each of the holder 142 and the circuit board 143 from the x- and y-axes are corrected. Additionally, angular misalignments of each of the holder 142 and the circuit board 143 around the x- and y-axes are corrected. Subsequently, the adhesive agent 16 is hardened. For instance, the adhesive agent 16 is a thermosetting adhesive. A laser beam is emitted over the front surface of the circuit board 143 from outside the circuit board 143. The adhesive agent 16 may alternatively be implemented by an ultraviolet cure adhesive. In this case, an ultraviolet ray is irradiated over the front surface of the circuit board 143 from outside the circuit board 143. Afterwards, the camera module 14 is put in a constant-temperature path to fully harden the adhesive agent 16. The front surface of the circuit board 143, as referred to above, is one of major surfaces thereof which are opposed to each other through a thickness of the circuit board 143.

Figure 5:
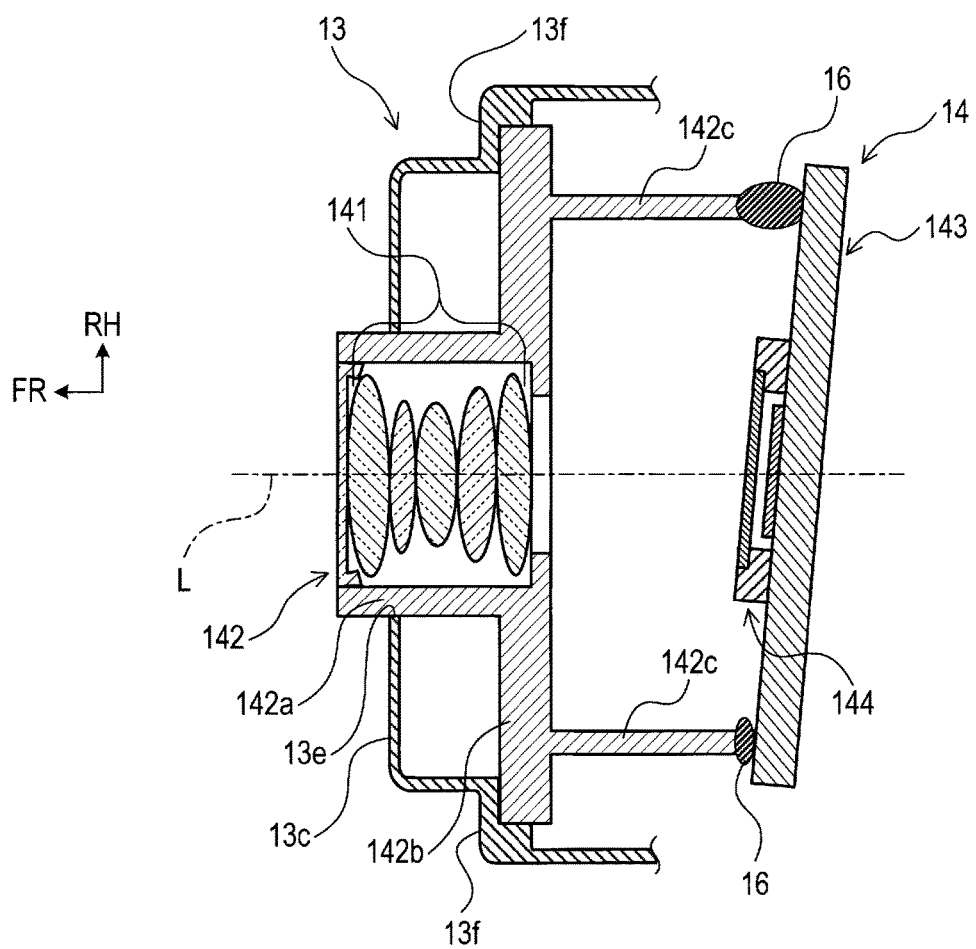
FIG. 5 is a sectional view, as taken along the line II-II in FIG. 1, which illustrates how much adhesive agent applied to a holder and a circuit board.

In this embodiment, if the parallelism between the base plate 142b and the circuit board 143 is, as demonstrated in FIG. 5, expected to be broken due to the above described, an applied amount of the adhesive agent 16 is adjusted in the following way. The greater a minimum direct distance between a portion of the resinous layer 143c exposed to the recess 147 and the end of the holder leg 142c facing the exposed portion of the resinous layer 143c, the greater the amount of the adhesive agent 16, as schematically illustrated in FIGS. 5 and 6, applied between the resinous layer 143c and the tip portion 142e.

For instance, a square line is imaginary drawn along an area of the front surface of the circuit board 143 where the recess 147 is to be formed. The amount of the adhesive agent 16 to be applied to the circuit board 143 is adjusted so that the longer a minimum direct distance between a portion of the resinous layer 143c exposed to the square line and the tip portion 142e of the holder leg 142c, the greater a sectional area of the adhesive agent 16, as taken perpendicular to the square line along the minimum direct distance.

Figure 6:
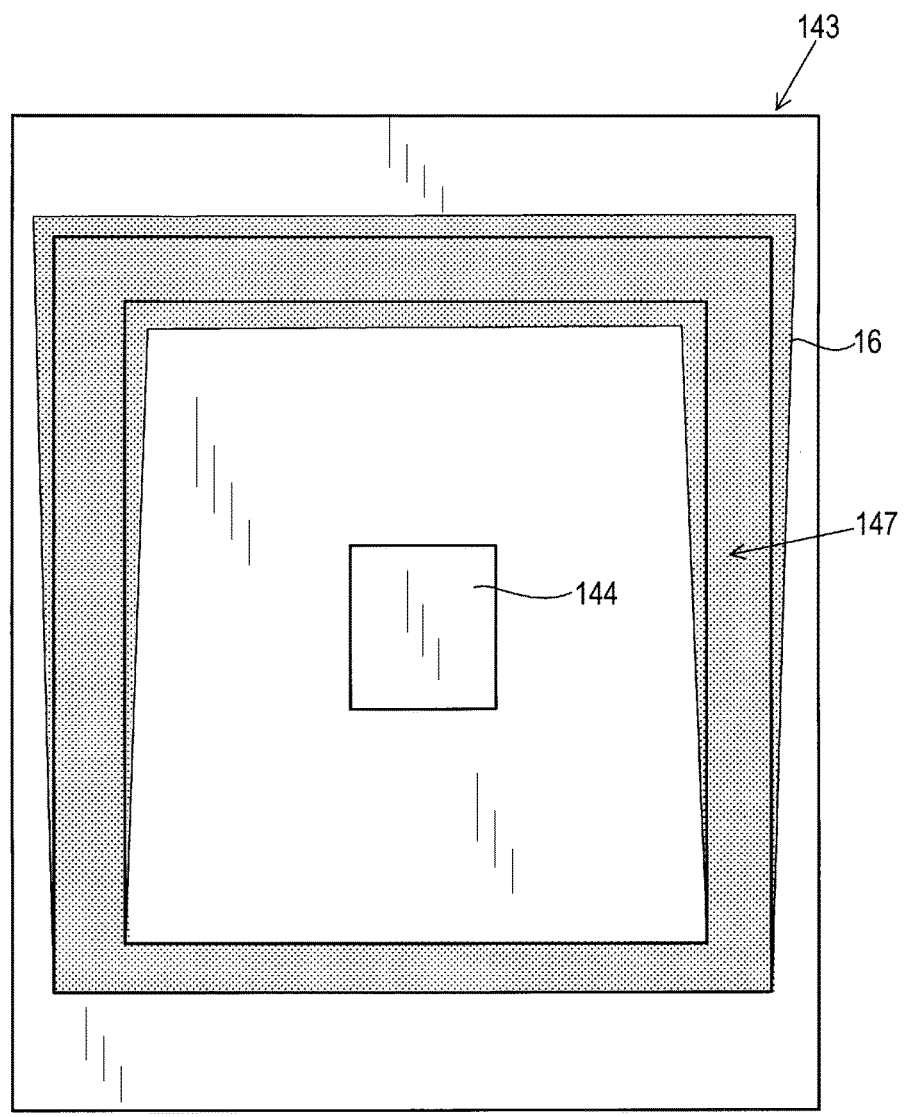
FIG. 6 is a front view which illustrates how to regulate the amount of adhesive agent applied to a circuit board.

In order to schematically emphasize the applied amount of the adhesive agent 16, FIG. 6 illustrates the width of a hatched area of the front surface of the circuit board 143 representing the adhesive agent 16 as being greater with an increase in applied amount of the adhesive agent 16. In practice, the adhesive agent 16 is thinner than illustrated in FIG. 6. Specifically, a larger amount of the adhesive agent 16 is put in a greater distance between the surface of the circuit board 143 and the holder leg 142c, so that the adhesive agent 16 has a longer length, as illustrated in FIG. 5, between the circuit board 143 and the holder leg 142c. The adhesive agent 16, therefore, has a substantially constant width which is nearly equal to an interval between the side walls 147b and 147c of the recess 147 along the length of the recess 147.

The structure of the camera device 11 in the first embodiment offers the following advantages.

1a) The recess 147 is formed on the surface of the circuit board 143 on which the solder resist 143a is formed. The recess 147 is made by removing portions of the solder resist 143a and the metallic layer 143b to expose the resinous layer 143c. The adhesive agent 16 joints a portion of the resinous layer 143c exposed to the recess 147 and the holder leg 142c of the holder 142 together. The adhesive agent 16 is thus, attached directly to the resinous layer 143c that is higher in adhesive power than the solder resist 143a and the metallic layer 143b, thereby ensuring the stability in joining between the circuit board 143 and the holder 142. This also improves the stability in positional relation between the image sensor 144 and the lenses 141.

1b) The protrusions 148 are seamlessly formed on at least portions of the edges of the opening of the recess 147 on the front surface of the solder resist 143a. When the adhesive agent 16 has not yet hardened, the protrusions 148 work as an overflow stopper to stop the adhesive agent 16 from flowing out of the recess 147, thereby enhancing the contribution of the adhesive agent 16 to the mechanical connection between the circuit board 143 and the holder 142. This results in an increased degree of adhesion between the circuit board 143 and the holder 142, thereby ensuring the stability in positional relation between the image sensor 144 and the lenses 141.

1c) In this embodiment, the adhesive agent 16 which does not yet harden is stopped from flowing to metallic parts or conducting parts: the image sensor 144, the electronic devices 145, and the electrodes 149, thereby avoiding reaction of the adhesive agent 16 with the conducting parts which will lead to migration or generation of stress due to a difference in coefficient of linear expansion between the electronic devices 145 and the adhesive agent 16.

1d) The side wall 148a of the first protrusion 148 which faces the recess 147 lies flush with the side wall 147b of the recess 147. Similarly, the side wall 148a of the second protrusion 148 which faces the recess 147 lies flush with the side wall 147c of the recess 147. A combination of the side walls 148a and 147b which are flush with each other or a combination of the side walls 148a and 147c which are flush with each other serves as a single wall or bank to block a flow of the adhesive agent 16 which has not yet hardened, thereby enhancing the contribution of the adhesive agent 16 to the mechanical connection between the circuit board 143 and the holder 142. This results in an increased degree of adhesion between the circuit board 143 and the holder 142, thereby ensuring the stability in positional relation between the image sensor 144 and the lenses 141.

1e) The resinous layer 143c exposed to the recess 147 and the rear end surface 142d of the holder leg 142c are subjected to surface treatment to have rough surfaces, thereby resulting in an increased area of contact of the resinous layer 143c and the rear end surface 142d with the adhesive agent 16 which will enhance the degree of adhesion therebetween (i.e., anchor effects). This ensures the stability in mechanically connection between the circuit board 143 and the holder 142 to keep the positional relation between the image sensor 144 and the lenses 141.

1f) The tip portion 142e of the holder leg 142c has a chamfered inner surface, in other words, tapers toward the rear end surface 142d in a cross section thereof, thereby minimizing a risk that the adhesive agent 16 which does not yet harden expands from the recess 147 cover the protrusions 148. This enhances the contribution of the adhesive agent 16 to the mechanical connection between the circuit board 143 and the holder 142. This results in an increased degree of adhesion between the circuit board 143 and the holder 142, thereby ensuring the stability in positional relation between the image sensor 144 and the lenses 141.

1g) The longer a minimum direct distance between a portion of the resinous layer 143c which is exposed to the recess 147 and the holder leg 142c facing the exposed portion of the resinous layer 143c (i.e., the adhesive-contacting portion), the greater the amount of the adhesive agent 16, as schematically illustrated in FIG. 5, put between the resinous layer 143c and the tip portion 142e of the holder leg 142c. If the amount of the adhesive agent 16 which is selected to be suitable for the shortest minimum direct distance over the holder leg 142c is uniformly applied between the resinous layer 143c and the holder leg 142c, it may result in a lack of a required degree of adhesion between a portion of the resinous layer 143c and a portion of the holder leg 142c where the minimum direct distance therebetween is relatively longer. Alternatively, if the amount of the adhesive agent 16 which is selected to be suitable for the longest minimum direct distance over the holder leg 142c is uniformly applied between the resinous layer 143c and the holder leg 142c, it may result in an excess amount of the adhesive agent 16 between a portion of the resinous layer 143c and a portion of the holder leg 142c where the minimum direct distance therebetween is relatively shorter, which lead to a risk that the adhesive agent 16 overflows from the recess 147 over the protrusions 148. In order to alleviate such a problem, this embodiment, as described already, selects a suitable amount of the adhesive agent 16, which is to be applied to the resinous layer 143c around the tip portion 142e of the holder leg 142c within the recess 147, as a function of the minimum direct distance between each portion of the resinous layer 143c and a corresponding portion of the holder leg 142c, thereby minimizing a risk that the adhesive agent 16 overflows from the recess 147 and achieving a desired degree of joint between the holder 142 and the circuit board 143. This ensures the stability in positional relation between the image sensor 144 and the lenses 141. The adjustment of the amount of the adhesive agent 16 in the above way is not essential to the invention.

Second Embodiment

Figure 7:
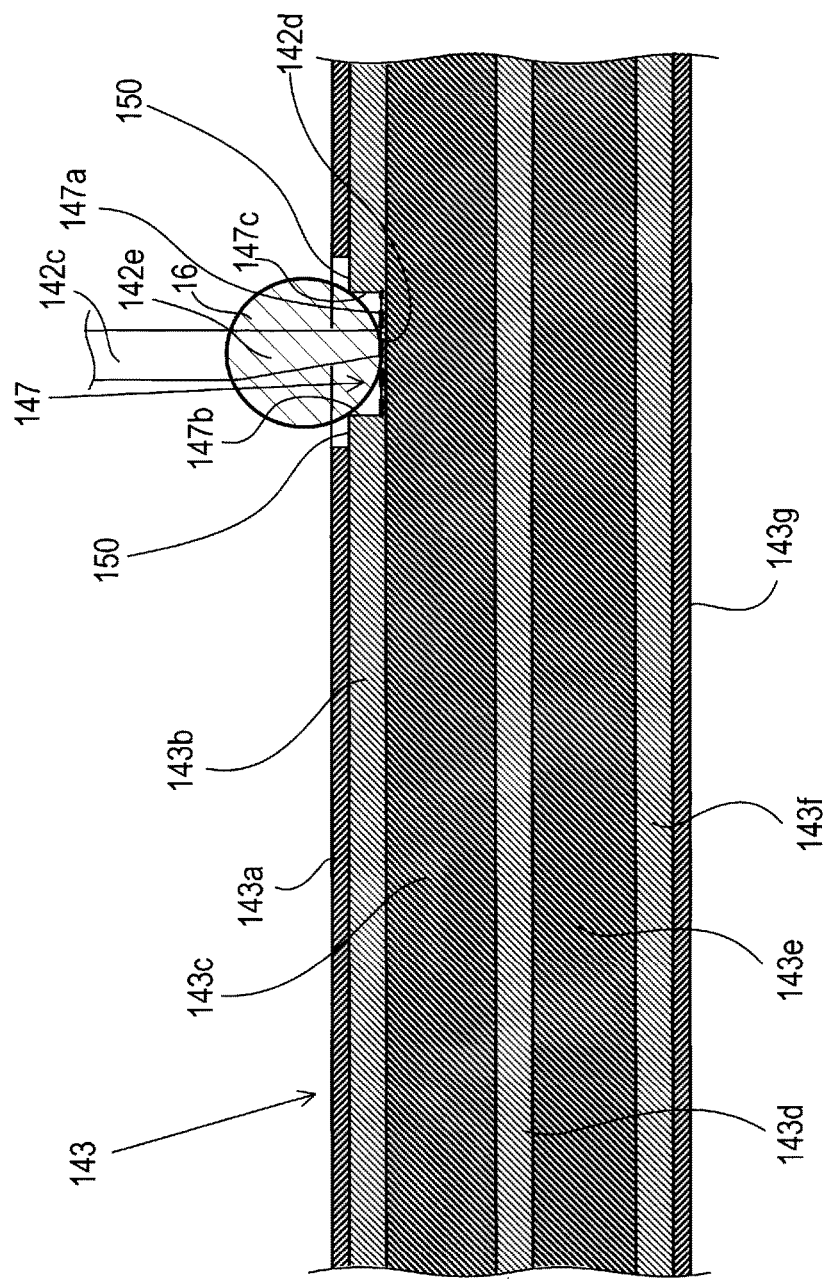
FIG. 7 is a partial sectional view which illustrates a region around a joint of a holder and a circuit board using an adhesive agent in the second embodiment.

The camera device 11 of the second embodiment will be described below with reference to FIG. 7. The camera device 11 of this embodiment is different only in structure of control board 143. The same reference numbers as employed in the first embodiment will refer to the parts, and explanation thereof in detail will be omitted here.

The structure of the first embodiment has the protrusions 148 working as an overflow stopper. The camera device 11 of the second embodiment is, as illustrated in FIG. 7, equipped with an overflow stopper 150 instead of the protrusions 148. The overflow stopper 150 is formed by a combination of the solder resist 143a and the metallic layer 143b in the recess 147, in other words, omission of portions of the solder resist 143a and the metallic layer 143b. Specifically, the overflow stopper 150 is defined by selecting the width of an omitted or removed portion of the metallic layer 143b to be smaller than that of a removed portion of the solder resist 143a. The width of the removed portion of the metallic layer 143b is an interval between edges of the metallic layer 143b which face with each other through the recess 147. Similarly, the width of the removed portion of the solder resist 143a is an interval between edges of the solder resist 143a which face with each other through the recess 147. In other words, the overflow stopper 150 is formed by inner shoulders of the recess 147 which are defined by inner corners of the metallic layer 143b which are exposed to the recess 147, in other words, to the tip portion 142e of the holder leg 142c.

The second embodiment offers the following beneficial effects in addition to the advantages 1a, 1e, 1f, and 1g, as described above, the first embodiment has.

2a) Copper from which the metallic layer 143b is made is generally known to have a degree of wetting or wettability between itself and a variety of adhesives including epoxy adhesive such as the adhesive agent 16 which is lower than that with respect to glass epoxy substrates. Consequently, before hardening, the adhesive agent 16 is drawn into the recess 147 as a function of a degree of surface tension of the adhesive agent 16 to the surface of the metallic layer 143b exposed to the overflow stopper 150 in the recess 147, thereby minimizing a risk that the adhesive agent 16 overflows from the recess 147. This provides the beneficial advantages 1b) and 1c), as described above.

2b) The formation of the overflow stopper 150 of this embodiment is easily achieved by selecting a pattern in which the copper (i.e., the metallic layer 143b) is etched, thereby resulting in a decrease in production cost of the camera device 11.

MODIFICATIONS

While the present invention has been disclosed in terms of the preferred embodiments in order to facilitate better understanding thereof, it should be appreciated that the invention can be embodied in various ways without departing from the principle of the invention. Therefore, the invention should be understood to include all possible embodiments and modifications to the shown embodiments which can be embodied without departing from the principle of the invention as set forth in the appended claims.

3a) The positional relation between the lens 141 and the image sensor 144 is subjected to the six-axis adjustment in the above embodiments, but however, it may be corrected by means of four-axis adjustment. The camera device 11 may alternatively be designed to have an optical member such as a filter, instead of the lens 141, which permits light to penetrate therethrough or reflects it toward the image sensor 144 using optical properties such as refraction, reflection, selective permeability, or optical rotation. The adjustment of the positional relation may be easily achieved depending upon the type of the optical member used.

3b) In the first embodiment, the protrusions 148 are made from ink using serigraph printing techniques, but may alternatively be formed using another material or in another way.

3c) The side walls 148a of the protrusions 148 need not lie flush with the side walls 147b and 147c, respectively. For instance, the recess 147 may be formed in a circular or an arc-shape, as facing the front surface of the circuit board 143. In this case, a combination of the side walls 148a and 147b and/or a combination of the side walls 148a and 147c may be shaped to have a single cylindrical surface. This also has the above described advantage 1d. In the case where the recess 147 is of an arc-shape, the line which is, as described above, imaginary drawn along an area of the front surface of the circuit board 143 where the recess 147 is formed and used to define the minimum direct distance between the resinous layer 143c and the holder leg 142c is a curved line.

3d) Each of the side walls 148a needs not be shaped to define a common planar or a curved surface together with a corresponding one of the side walls 147b and 147c, but however, may alternatively be oriented to intersect with the corresponding one at a given angle.

3e) The tip portion 142e of the holder leg 142c is, as described above, tapered toward the circuit board 143, but may alternatively be shaped to have a constant thickness. The structure which offers the above described advantage 1f is not limited to the one, as described above. For instance, the tip of the holder 142 facing the circuit board 143 may be shaped to have a jagged, serrated, or sawtooth-like surface so that an adhesive-contacting portion that is a portion of the holder 142 contacting with the adhesive agent 16 has a sectional area decreasing in a direction in which the holder 142 approaches or is inserted into the recess 147 of the circuit board 143 during a production process of the camera device 11, thus offering the above described advantage 1f. If the adhesive-contacting portion of the holder 142 is defined in the above manner, the holder 142 may be designed to have the adhesive-contacting portion in a region other than the rear end surface 142d and the top portion 142e of the holder leg 142c or alternatively have the tip portion 142e which is not partially used as the adhesive-contacting portion.

3f) In the above embodiments, the surface roughening treatment is performed both on the resinous layer 143c and on the rear end surface 142d, but however, may alternatively be executed only on either one of them, not executed on both of them, or additionally executed on the surface of the tip portion 142e.

3g) In the above embodiments, the recess 147 is seamlessly formed in the shape of a frame, in other words, in a rectangular form, as facing the front surface of the circuit board 143, but however, may alternatively be made up of a plurality of discrete grooves which are separate at selected intervals away from each other. For instance, grooves or recesses may be formed in four corners of the hatched area in FIG. 4 or in such four corners and the middle of each side of the hatched area. In this case, between the adjacent recesses, the holder 142 may not be adhered to the surface of the circuit board 143 or may be attached to the solder resist 143a in a known manner.

3h) The function or task of one of the above described components of the camera device 11 in the above embodiments may be shared with two or more of them. The tasks of two or more of the components of the camera device 11 may alternatively be allocated to one of the components. The components of the camera device 11 may be partly omitted. The component(s) of the camera device 11 in one of the embodiments or modifications may be added to another embodiment or modification or replaced with that of another embodiment or modification. Therefore, the invention should be understood to include all possible embodiments and modifications to the shown embodiments which can be embodied without departing from the principle of the invention as set forth in the appended claims.

What is claimed is:

1. A camera device comprising:
a circuit board (143) which has a first surface and a second surface opposed to each other through a thickness thereof, said circuit board at least partially including a stack of a solder resist (143a), a metallic layer (143b), and a resinous layer (143c) which are laid in this order from a side of the first surface to a side of the second surface;
an image sensor (144) which is disposed on the first surface of the circuit board;
an optical member (141) which works to direct light to said image sensor;
a holder (142) which holds said optical member;
a recess (147) which is formed in the first surface of said circuit board by omission of portions of said solder resist and said metallic layer so as to expose a portion of the resinous layer to said recess;
an adhesive agent (16) which achieves attachment between the portion of said resinous layer exposed to said recess and said holder; and
an overflow stopper (148, 150) which is seamlessly formed on a portion of a surface of the solder resist which defines the first surface of said circuit board, said overflow stopper forming at least a portion of said recess.

2. A camera device as set forth in claim 1, wherein said overflow stopper (148) is defined by a protrusion formed on an edge of an opening of the recess, and wherein the overflow stopper has a side wall (148a) which faces the recess and lies in flush with one of side walls of said recess which is closer to the overflow stopper.

3. A camera device as set forth in claim 1, wherein said overflow stopper is defined by the omitted portion of the metallic layer, and wherein a width of the omitted portion of the metallic layer is smaller than that of the omitted portion of the solder resist.

4. A camera device as set forth in claim 1, wherein said holder has an adhesive-contacting portion which is placed in contact with said adhesive agent, the adhesive-contacting portion having at least a portion whose surface is rougher than that of a rest of said holder.

5. A camera device as set forth in claim 1, wherein said resinous layer has an adhesive-contacting portion that is exposed to said recess and placed in contact with said adhesive agent, the adhesive-contacting portion of said resinous layer having at least a portion whose surface is rougher than that of a rest of said resinous layer.

6. A camera device as set forth in claim 1, wherein said holder has an adhesive-contacting portion placed in contact with said adhesive agent, and wherein the adhesive-contacting portion of said holder has a sectional area which decreases in a direction in which said holder approaches or is inserted into said recess.

7. A camera device as set forth in claim 1, wherein said holder has an adhesive-contacting portion placed in contact with said adhesive agent, and wherein the longer a minimum direct distance between a portion of the resinous layer exposed to said recess and the adhesive-contacting portion of said holder, the greater the amount of said adhesive agent applied between said resinous layer and the adhesive-contacting portion.

* * * * *